(12) United States Patent
Seifert

(10) Patent No.: US 6,656,279 B2
(45) Date of Patent: Dec. 2, 2003

(54) APPARATUS FOR THE SPRAY TREATMENT OF PRINTED CIRCUIT BOARDS

(75) Inventor: Dietmar Seifert, Auenwald-Mittelbruden (DE)

(73) Assignee: Pill e.K., Auenwald (DE)

( * ) Notice: Subject to any disclaimer, the term of this patent is extended or adjusted under 35 U.S.C. 154(b) by 0 days.

(21) Appl. No.: 10/071,210

(22) Filed: Feb. 11, 2002

(65) Prior Publication Data

US 2003/0150381 A1 Aug. 14, 2003

(51) Int. Cl.[7] .................................................. B05C 5/02
(52) U.S. Cl. ...................... 118/602; 118/50; 118/314; 118/316; 118/324; 118/326
(58) Field of Search ............................. 118/602, 50, 314, 118/316, 324, 326; 427/96, 421, 294; 134/64 R

(56) References Cited

U.S. PATENT DOCUMENTS 5,002,616 A * 3/1991 Ketelhohn .................. 134/25.1
5,614,264 A * 3/1997 Himes ........................ 427/424

FOREIGN PATENT DOCUMENTS

| DE | 41 21 032 A1 | 1/1993 |
| DE | 198 30 212 A1 | 1/2000 |

* cited by examiner

Primary Examiner—Laura Edwards
(74) Attorney, Agent, or Firm—Browdy and Neimark, P.L.L.C.

(57) ABSTRACT

Proposed is an apparatus for the spray treatment of printed circuit boards. It has conveyor means for conveying the printed circuit boards (2) with a horizontally oriented PCB surface plane. Provided above the plane of conveyance (7) is a nozzle device (16) for spraying the top surface (13) of the printed circuit boards (2) with a liquid treatment medium. The apparatus is equipped with a suction device (26) that permits the sprayed-on treatment medium to be suctioned off from the top surface (13) of the printed circuit boards (2) during the spray process. In this manner the treatment medium is prevented from backing up, and a high-quality treatment process is ensured.

20 Claims, 2 Drawing Sheets

APPARATUS FOR THE SPRAY TREATMENT OF PRINTED CIRCUIT BOARDS

Figure 1:
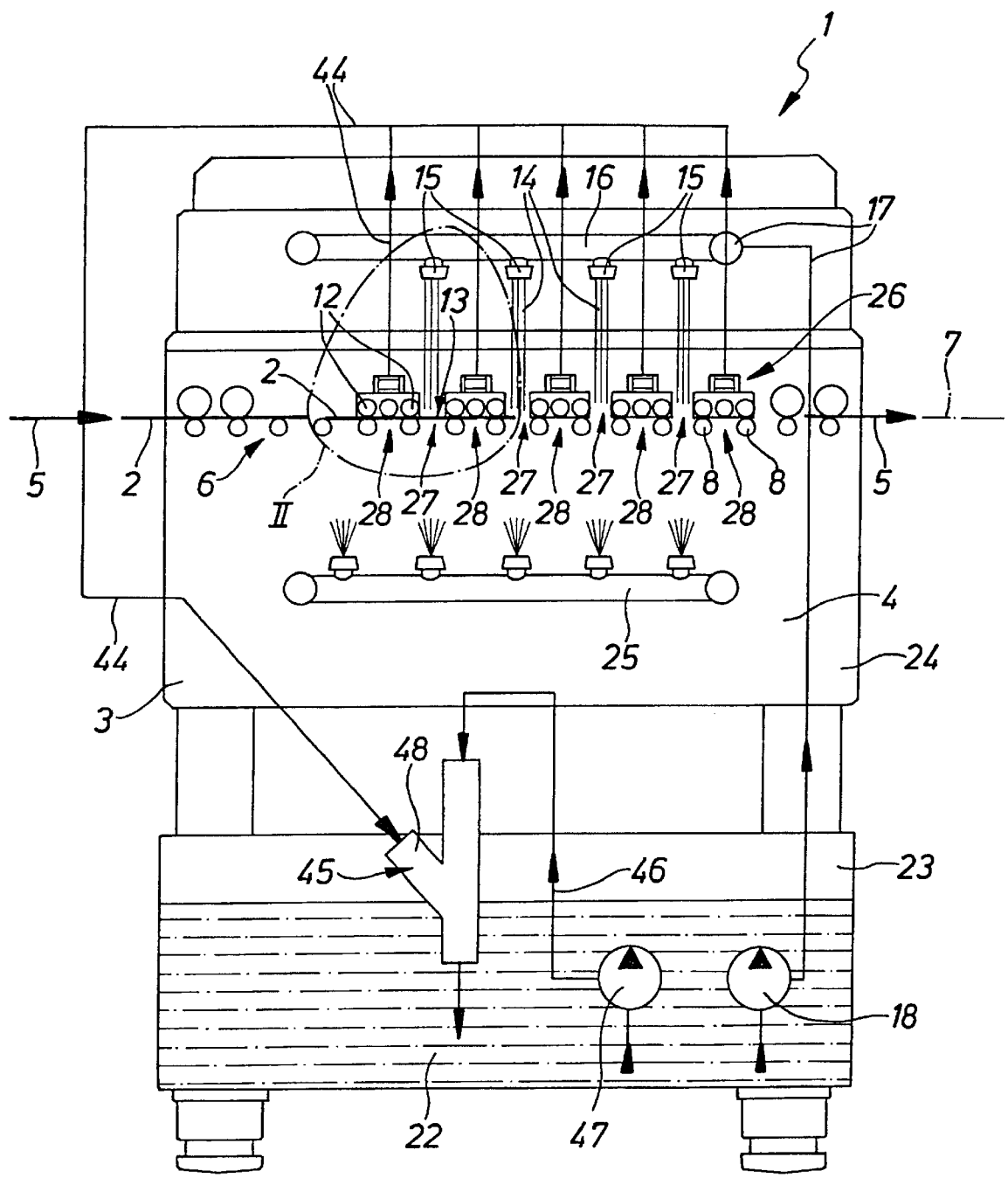

The present invention relates to an apparatus for the spray treatment of printed circuit boards in the course of the printed circuit board (PCB) production, having means of conveyance for conveying the PCBs with a horizontally oriented PCB surface plane, also a nozzle device disposed above the plane of conveyance of the PCBs for spraying the top surface of the PCBs with a liquid treatment medium stored in a reservoir, and a suction device for suctioning off the sprayed-on treatment medium from the top surface of the PCBs during the spray process.

A treatment apparatus of the above type becomes apparent from DE 41 21 032 A1. It is used, for example, in the etching treatment of PCBs within the framework of the PCB production. A problem in the production of PCBs generally lies in the fact that the treatment fluid that is sprayed from above onto the horizontally conveyed PCBs does not drain quickly enough, with the result that the fluid may back up, which can result in an uneven treatment and possibly even in damage to the PCBs. To counter this problem, in the known apparatus the PCBs being treated are subjected from above simultaneously to a spray process and a suction process. While passing through the apparatus, the PCBs are sprayed with the desired liquid treatment medium, for example with an etching, developing or rinsing fluid; and a suction process, within the framework of which the sprayed-on liquid is directly suctioned off from the top surface of the PCB, takes place parallel to the spray process. In this manner a backing up of fluid is prevented and the PCBs are also very effectively freed from residual fluid even if apparatus components are present that interfere with a normal draining of the liquid. The suction device, as a rule, cannot remove the entire sprayed-on treatment medium, of course. However, the suction intensity can be selected such that the effect of the resulting inevitable fluid removal has a very positive influence on the treatment result.

The suction effect in the known treatment apparatus is created by a vacuum pump, which has a preceding container that serves to separate suctioned off liquid fractions and air fractions. The air is drawn off and the separated treatment medium is carried back into the reservoir to be available for a new spray treatment.

Separating the air from the treatment medium within the suction branch requires a very complex and expensive layout. The same applies for the steps to filter out the separated air, which is released into the environment.

From DE 198 30 212 A1 an apparatus is known for treating objects, for example PCBs, wherein the objects being treated are fed translationally to a treatment bath and rotated in the treatment bath. A suction device permits fluid that adheres to the objects to be suctioned off. The negative pressure required for this can be generated with suitable sets of equipment, especially with water-jet pumps.

The present invention has as its object to reduce the layout complexity and expense connected with the suction measures while maintaining a high-quality and even treatment process for the PCBs.

This object is met with a circulation cycle that is provided with a circulating pump and incorporates an ejector device that is fed with treatment medium through the circulating pump and on the suction side of which the negative pressure, which is required for the suction operation, is tapped off.

In this manner the negative pressure that is required for the suction can be generated in a closed cycle within the treatment apparatus itself. Within the ejector device the circulated treatment medium serves to generate the desired suction effect so that neither a separation of air and treatment medium becomes necessary nor expensive filtering measures to filter out the air. The technical complexity and, hence, also the expenditure can accordingly be kept low while attaining a very high suction performance.

Advantageous improvements of the invention will become apparent from the subclaims.

The nozzle device is advantageously designed such that it defines at least one spray zone in such a way that the spray zone has corresponding preceding and succeeding suction zones of the suction device relative to the direction of conveyance. The suction result is optimal if both a suction zone that precedes the given spray zone and a suction zone that succeeds it exist, because the sprayed-on treatment medium is, in this case, suctioned off reliably both at the front and the back and no dust is generated.

Particularly advantageous is an embodiment in which a plurality of successive, spaced-apart spray zones, each of which are flanked by a preceding and a succeeding suction zone, are provided in the direction of conveyance of the PCBs.

The suction device is designed especially in such a way that it develops its suction effect across the entire width of the PCB.

The suction device preferably has a suction nozzle arrangement that is placed immediately above the plane of conveyance of the PCBs and advantageously incorporates at least one suction nozzle unit consisting of one or multiple suction nozzles that extend crosswise to the plane of conveyance. In a solution with a particularly simple design the suction nozzle units are formed by suction tubes that are provided with one or more slit-like openings, which constitute the suction nozzles.

The means of conveyance for the PCBs advantageously have lower conveyor rollers on which the PCBs are moved along during the spraying and suction process. Upper conveyor rollers may additionally be provided that act upon the top surface of the PCBs to ensure an exact guiding and optionally also to hold them securely in place relative to the suction effect from above. The upper conveyor rollers may be vertically movable to attain an automatic adjustment to the thickness of the given PCB.

If the suction device is designed such that it is effective in only one or advantageously in multiple suction zones that are spaced apart in the direction of conveyance, a suction nozzle unit, e.g., a suction tube, that extends crosswise to the direction of conveyance and has both preceding and succeeding conveyor rollers, may be provided in at least one and preferably in each suction zone. The possibility exists to combine a given suction nozzle unit together with the adjacent upper conveyor rollers into a separately operable suction unit that can be installed or exchanged independently from other suction units.

The conveyor rollers may, for example, be formed by individual rollers that are spaced apart with the same rotation axes, however, a cylinder-like design, for example, would be possible as well.

Figure 2:
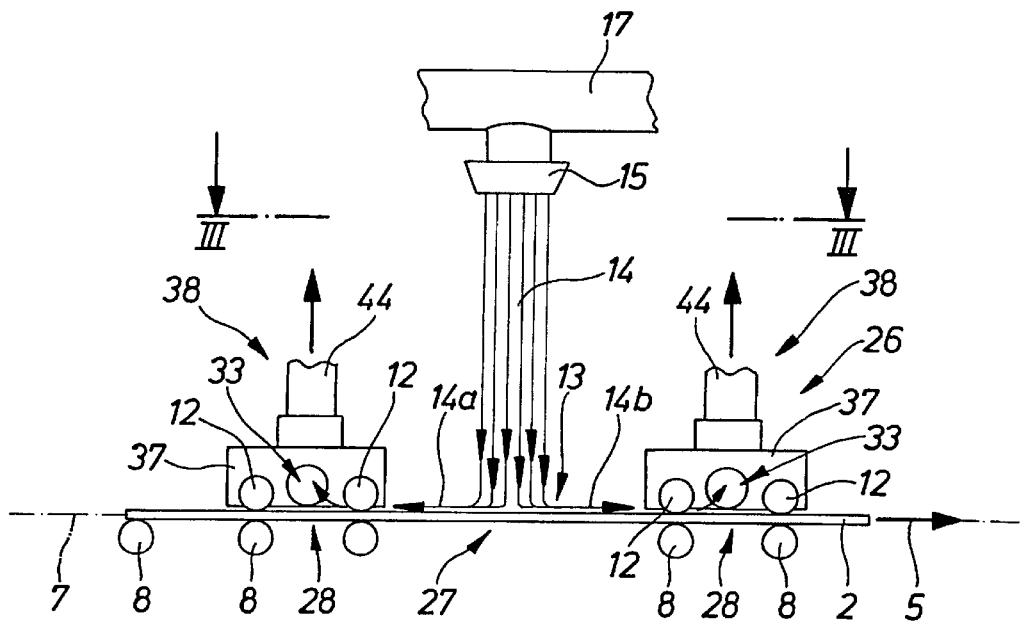
Figure 3:
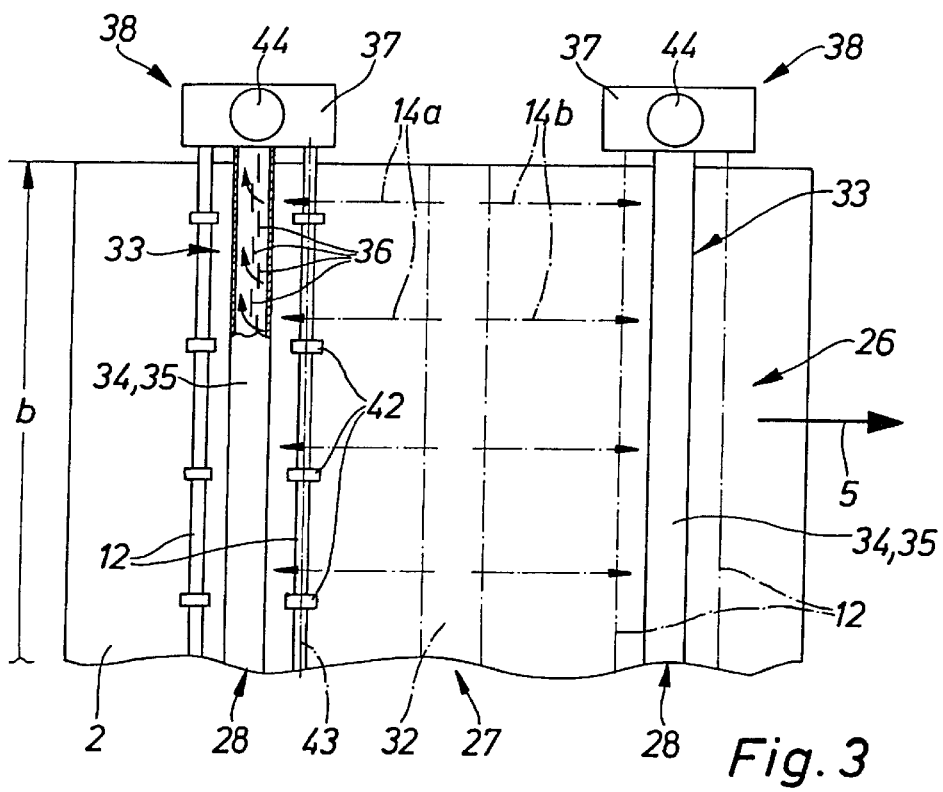

The invention will be explained in more detail below based on the appended drawings, in which:

FIG. 1 shows a first embodiment of the inventive apparatus in a side view, in a very schematic illustration, FIG. 2 shows the area II that is circled in a dot-and-dash pattern in FIG. 1 as an enlarged single illustration, and FIG. 3 shows a top view of the section in FIG. 2 according to the section line III—III.

The treatment apparatus shown in FIG. 1 and generally marked with the reference numeral 1, is intended for the spray treatment of PCBs in the course of the PCB production. It may be employed, for example, for the etching treatment, for the developing treatment and/or for the rinsing treatment of PCBs.

The treatment apparatus 1 is preferably designed as a spray treatment module, i.e., as a module-like unit that can be combined into a system with other operating modules of any kind.

The treatment apparatus 1 comprises a housing 3 that defines in its interior a treatment chamber 4. PCBs 2 that are being treated pass through the treatment chamber 4 in a direction of conveyance 5 indicated by arrows. Suitable means of conveyance 6 define a horizontally extending plane of conveyance 7 through which the PCBs 2 pass with an also horizontally oriented PCB surface plane in the direction of conveyance 5.

The means of conveyance 6 in the shown embodiment incorporate lower conveyor rollers 8 that may be distributed and oriented in the style of a roller conveyor and that are at least in part rotation actuated to move the PCBs forward. While passing through the treatment chamber 4, the PCBs 2 rest with their flat bottom surface on top of the lower conveyor rollers 8 and are moved horizontally by the same.

The means of conveyance 6 in the shown embodiment additionally incorporate upper conveyor rollers 12 that are distributed above the plane of conveyance 7 longitudinally to the same and which can roll off on the vertically upward oriented top surface 13 of the PCBs 2 passing through the treatment apparatus 1. These upper conveyor rollers 12 advantageously do not have a drive of their own and serve to stabilize the horizontal position of the PCBs 2. They may assume the function of holding-down devices. By means of measures that are not shown in detail, such as rotational axes that are movably guided in vertical slots, it can be ensured that the upper conveyor rollers 12 are vertically movable and automatically adjust in their height position to the thickness of the PCBs.

During their conveyance along the plane of conveyance, the PCBs 2 are generally moved in successive order. Their two large-surface sides are facing up and down, respectively, in the process. Their conveyance through the treatment apparatus 1 preferably takes place within the framework of a continuous movement.

While passing through the treatment apparatus 1 the PCBs 2 are being sprayed with a liquid treatment medium. In the case of an etching treatment, an etching liquid may be used that is based on copper chloride or on an alkaline medium. The etching fluid etches away, in a manner known per se, copper layer portions that are not needed from the surfaces of the printed circuit boards, so that only those conductor paths remain that are needed for an electronic circuitry. In other treatment methods other appropriate treatment fluids are used.

The liquid treatment medium is applied in the form of directed sprays 14 from above onto the upward facing PCB surface, referred to as the top surface 13, of a given PCB 2. The directed sprays 14 are generated by a plurality of stationary spray nozzles 15 that are combined in a nozzle device 16 also referred to as a blast connection. It is located within the treatment chamber 4 above the plane of conveyance 7 passed through by the PCBs 2.

Via a spray channel system 17, in part shown only schematically, which is generally assembled from conduits, all spray nozzles 15 are connected to a supply pump 18 that supplies the treatment medium. This treatment medium, marked with the reference numeral "22" in FIG. 1, is located inside a reservoir 23 of the treatment apparatus 1 and preferably below the treatment chamber 4, which is formed inside a treatment container 24. The treatment container 24 and the reservoir 23 are advantageously designed as a physical unit and connected to one another according to fluidics principles in such a way that any treatment medium that is sprayed in the treatment chamber 4 can flow back into the reservoir 23. The treatment medium thus moves through a cycle during the treatment process, which is maintained by the supply pump 18.

The treatment apparatus 1 may additionally incorporate a further nozzle device 25, which is also fed by the supply pump 18 and is disposed below the plane of conveyance 7 of the PCBs 2 in the treatment chamber 4. This additional nozzle device 25 sprays the PCBs 2 from below on their bottom surfaces as they pass through the treatment apparatus 1.

Problematic in the treatment of PCBs 2 is the treatment of the PCB surface that faces upward during the treatment process, which is referred to as the top surface 13 in the present embodiment. Due to the strong directed sprays 14 and the high throughput rate, the sprayed-on treatment medium cannot immediately drain, so that fluid may back up, which results in a long retention time of the treatment fluid on the top surface 13 of the PCBs. This behavior is particularly pronounced in cases in which, as in the shown embodiment, components of the means of conveyance 6—in the present case the upper conveyor rollers 12—interact with the top surface 13 of the PCBs 2, since they form an additional drainage obstacle to the sprayed-on treatment medium. This problem does not occur in the spray treatment of the bottom surface of the PCBs because the treatment medium automatically falls off to the bottom due to gravity.

To remedy the described problem, the treatment apparatus 1 is additionally provided with a suction device 26, the details of which become apparent especially in FIGS. 1 and 2. It permits the treatment medium that is sprayed from above to be suctioned off from the top surface 13 of the PCBs 2 while a spray process relative to the given PCB 2 simultaneously takes place through the nozzle device 16. The sprayed-on treatment medium is thus largely suctioned off from the PCB 2 shortly after hitting the PCB 2, for which a suction rate is advantageously selected that corresponds to at least the spray rate so that, in principle, the entire sprayed-on treatment medium could be suctioned off. As a rule, not the entire sprayed-on treatment medium is suctioned off, of course, since it can partially also drain over the lateral edge of the PCBs 2 and fall off to the bottom.

Depending on the design of the nozzle device 16, the treatment apparatus 1 is provided with one or preferably with a plurality of successive, spaced-apart spray zones 27 that are disposed in the direction of conveyance 5. A spray zone 27 is always located where a directed spray 14 hits the plane of conveyance 7 or a PCB 2 that is moved along same.

The suction device 26 is advantageously designed such that each spray zone 27 is located in the direction of conveyance 5 between two suction zones 28 in which a suction takes place. Each spray zone may thus have two corresponding suction zones 28 that precede and succeed the former relative to the direction of conveyance.

A directed spray 14 in the spray zone 27, as a general rule, hits the PCB 2 passing through the spray zone 27 across the entire width of the PCB (contact zone 32). In the process, the directed spray 14 divides in the contact zone 32, comparable to the schematic illustration in FIGS. 2 and 3, so that two main flows 14a, 14b result, one of which runs against the direction of conveyance 5 and one runs parallel with the direction of conveyance 5, both across the entire PCB width b. These main flows 14a, 14b thus enter into the suction zones 28 that precede and succeed the spray zone 27, where they are suctioned off upward by the suction device 26. The largest portion of the sprayed-on treatment medium is thus removed from the top surface 13 of the PCBs 2 by suction. Remaining portions of the sprayed-on treatment medium can flow off crosswise to the direction of conveyance 5 over the lateral edges of the PCBs 2 as usual and drain into the treatment container 24.

From those suction zones 28 that are located between two successive spray zones 27, a main flow from two adjacent directed sprays 14 is advantageously suctioned off at the same time.

The removal by suction of the sprayed-on treatment medium is advantageously performed by means of a suction nozzle assembly 33 that is installed immediately above the plane of conveyance 7 of the PCBs 2. In the shown embodiment, this suction nozzle assembly 33 contains, per suction zone 28, a suction nozzle unit 34, preferably in the form of a suction tube 35, that extends parallel to the plane of conveyance 7, crosswise and especially at a right angle to the direction of conveyance 5. Each suction tube 35 is provided on its downward facing circumference section that faces the plane of conveyance 7 with at least one but preferably with multiple suction nozzles 36 which, together, cover the entire PCB width b. The suction nozzles 36 preferably are slit-like openings of the suction tube 35 which, in the case of a multiple-unit design according to FIG. 3, may form a row of suction nozzles that coincides with the longitudinal extension of the suction tube 35, in which case an overlapping of successive suction nozzles 36 in the longitudinal direction of the tube is recommended.

The suction nozzle units 34 or suction tubes 35, respectively, may be fixed on the front ends of holding members 37 whereby a preferably removable fastening to the treatment container 24 may be attained.

In this context there also exists the advantageous possibility to combine the individual suction nozzle units 34 together with adjacent upper conveyor rollers 12 into separately operable suction units 38. In this manner a modular design can be implemented very easily. Provision may be made in particular for each suction nozzle unit 34 to have two corresponding upper conveyor rollers 12, which extend crosswise to the direction of conveyance 5, in such a way that one of them precedes the suction unit 34 relative to the direction of conveyance 5 and the other one succeeds it. These upper conveyor rollers 12 may be rotationally supported on the holding members 37 that are provided at the ends.

The upper conveyor rollers 12 may consist of individual rollers 42, according to FIG. 3, for example, that are lined up spaced apart with a joint rotational axis 43 across the PCB width b, and the same also applies to the lower conveyor rollers 8. It goes without saying, however, that the conveyor rollers may, in principle, have any desired design, and cylinder-shaped designs, for example, are possible as well. However, the arrangement is advantageously always made such that the directed sprays 14 after hitting a PCB 2 and subsequently being deflected are able to pass by the adjacent upper conveyor rollers and enter into the influx region of the adjoining suction nozzle units 34.

The suction nozzle assembly 33 is connected to a suction channel system 44 whereby the desired suction effect is generated in the region of the suction nozzles 36. The suction channel system 44 may, comparable to the spraying channel system 17, consist at least in part of conduits and is shown in the drawing only schematically. Suitable conduits may be connected, for example, to the holding members 37 in order to create through these a connection to the interior of the given corresponding suction tube 35. A direct connection would also be possible, of course.

The suction channel system 44 is connected to the suction side of an ejector device 45 which is housed, for example, in the interior of the reservoir 23 or at another suitable location within the treatment apparatus 1. This ejector device 45 is furthermore integrated into a circulation cycle 46, which is equipped with a circulating pump 47. The circulation cycle 46 is a closed cycle wherein the circulating pump 47 draws in treatment medium 22 from the reservoir 23 and pushes it through the ejector device 45, and the medium that flows out through the ejector device 45 reenters the reservoir 23. While flowing through the ejector device 45, the circulating treatment medium causes, at a suction connection 48 of the ejector device 45, a negative pressure, which is routed via the suction channel system 44 to the suction nozzle assembly 33.

Based on the described operation, the treatment medium that is suctioned off from the top surface of the PCBs 2 is also circulated back into the reservoir 23 through the suction connection 48 of the ejector device 45.

There thus exists an internal closed cycle of the entire treatment medium, rendering external suction units unnecessary and separation or filtering processes superfluous.

The ejector device 45 is advantageously equipped with a venturi nozzle in a manner known per se. To be able to meet the called-for performance requirements, multiple such venturi nozzles can be provided without problem, and the possibility exists to divide the suction nozzle assembly 33 into individual steps, which are then actuated with negative pressure independently from one another.

In the depicted treatment apparatus a layout has proven advantageous in which immediately adjacent suction zones 28 are spaced apart in the direction of conveyance 5 by approximately 10 cm to one another and the jet width of the directed spray 14 extending in between, measured in the same direction, is approximately in the range between 5 mm and 15 mm.

What is claimed is:

1. An apparatus for the spray treatment of a printed circuit board in the course of production of the printed circuit board (PCB), comprising
    means of conveyance (6) for conveying the PCB (2) with a horizontally oriented PCB surface plane,
    a nozzle device (16) disposed above the plane of conveyance (7) of the PCB (2) for spraying a top surface (13) of the PCB (2) with a liquid treatment medium stored in a reservoir (23),
    a suction device (26) for suctioning off the sprayed-on treatment medium from the top surface of the PCB (2) during spray treatment,
    a circulation cycling system (46) for suctioned off treatment medium, said circulation cycling system (46) being equipped with a circulating pump (47) and containing an ejector device (45) that is supplied by the circulating pump (47) with treatment medium and on a suction side of said ejector device (45) of which negative pressure is tapped off that is required for the suction operation.

2. An apparatus according to claim 1, wherein at least one spray zone (27) is defined by the nozzle device (16) and by suction zones (28) of the suction device (26) that precede and/or succeed the spray zone (27) relative to the direction of conveyance (5) of the PCBs (2).

3. An apparatus according to claim 2, wherein a plurality of successive spaced-apart spray zones (27) are disposed in the direction of conveyance (5) of the PCBs (2), said spray zones (27) each being flanked by a preceding and a succeeding suction zone (28).

4. An apparatus according to claim 1, wherein the suction device (26) is constructed such that it develops its suction effect across the entire PCB width.

5. An apparatus according to claim 1, wherein the suction device (26) incorporates a suction nozzle assembly (33) that is located immediately above the plane of conveyance (7) of the PCBs (2).

6. An apparatus according to claim 5, wherein the suction nozzle assembly (33) incorporates at least one suction nozzle unit (34) composed of one or more suction nozzles (36) that extend crosswise to the direction of conveyance (5).

7. An apparatus according to claim 6, wherein the suction nozzle unit (34) is formed by a suction tube (35) that is provided with one or more suction nozzles (36), said suction tube (35) extending above the conveyance level (7) crosswise to the direction of conveyance (5).

8. An apparatus according to claim 6, wherein a given suction nozzle (36) comprises a slit-shaped opening.

9. An apparatus according to claim 1, wherein lower conveyor rollers (8), which carry the PCBs (2), are provided to define the plane of conveyance (7), with additional upper conveyor rollers (12) being provided that can interact with the PCBs (2) from above and are optionally vertically movable to adjust to the given PCB thickness.

10. An apparatus according to claim 9, wherein the suction device (26) is effective in one or in a plurality of suction zones (28) that are spaced apart in the direction of conveyance (5), wherein a suction nozzle unit (34) that extends crosswise to the direction of conveyance (5) with adjoining preceding or succeeding upper conveyor rollers (12) is provided in at least one suction zone (28).

11. An apparatus according to claim 10, wherein at least one suction nozzle unit (34) is combined with adjoining upper conveyor rollers (12) into a separately operable suction unit (38).

12. An apparatus according to claim 1, configured as a spray treatment module.

13. An apparatus according to claim 1, wherein the spray treatment is an etching treatment, a developing treatment and/or a rinsing treatment.

14. An apparatus according to claim 1, wherein, to hold the treatment medium to be sprayed, a reservoir (23) is provided, to which the suctioned-off treatment medium is carried back.

15. An apparatus according to claim 1, wherein the ejector device (45) is housed in the interior of the reservoir (23).

16. An apparatus according to claim 1, wherein the suction device (26) incorporates a suction nozzle assembly (33) that is divided into individual steps, which can be actuated with negative pressure independently from one another.

17. An apparatus according to claim 1, wherein the ejector device (45) is equipped with a plurality of venturi nozzles.

18. An apparatus according to claim 3, wherein the suction device (26) incorporates a suction nozzle assembly (33) that is located immediately above the plane of conveyance (7) of the PCBs (2).

19. An apparatus according to claim 7, wherein a given suction nozzle (36) comprises a slit-shaped opening.

20. An apparatus according to claim 19, wherein lower conveyor rollers (8), which carry the PCBs (2), are provided to define the plane of conveyance (7), with additional upper conveyor rollers (12) being provided that can interact with the PCBs (2) from above and are vertically movable to adjust to the given PCB thickness.

* * * * *